United States Patent [19]

Ternes

[11] Patent Number: 5,485,679
[45] Date of Patent: Jan. 23, 1996

[54] IMAGE REGISTRATION BOARD AND COMPRESSIBLE PIN ASSEMBLY

[75] Inventor: Gretchen Ternes, Shoreview, Minn.

[73] Assignee: Ternes-Burton Company

[21] Appl. No.: 780,739

[22] Filed: Oct. 18, 1991

[51] Int. Cl.[6] .................................................. G01D 21/00
[52] U.S. Cl. .................................................. 33/623
[58] Field of Search ........................... 33/623, 614, 615, 33/617, 619, 620, 621; 355/32, 75, 79, 88

[56] References Cited

U.S. PATENT DOCUMENTS

| | | |
|---|---|---|
| 1,996,966 | 4/1935 | Koppe . |
| 2,599,859 | 6/1952 | Ogg . |
| 2,871,572 | 2/1959 | Gutzmer .................................. 33/623 |
| 2,983,049 | 5/1961 | Andrisani . |
| 3,400,630 | 9/1968 | Carlson . |
| 3,456,587 | 7/1969 | Hullen . |
| 3,480,364 | 11/1969 | Barnett .................................. 355/75 |
| 3,634,009 | 1/1972 | Van Dusen . |
| 3,771,870 | 11/1973 | Taylor . |
| 3,877,808 | 4/1975 | Jasperson, Jr. . |
| 3,922,087 | 11/1975 | Dillow . |
| 4,139,294 | 2/1979 | Aneshansley et al. . |
| 4,294,539 | 10/1981 | Spehrley, Jr. . |
| 4,445,775 | 5/1984 | Tongel . |
| 4,636,067 | 1/1987 | Richards, Sr. . |
| 4,664,511 | 5/1987 | Carlson et al. .................................. 355/75 |
| 4,774,552 | 9/1988 | Nishihama et al. . |
| 4,791,459 | 12/1988 | Hoffman . |
| 4,896,188 | 1/1990 | Byers . |
| 4,977,683 | 12/1990 | Harder . |
| 4,987,686 | 1/1991 | Ternes . |

FOREIGN PATENT DOCUMENTS

| | | |
|---|---|---|
| 535732 | 1/1957 | Canada . |
| 1184203 | 12/1964 | Germany . |
| 2437596 | 2/1976 | Germany .................................. 355/79 |

Primary Examiner—Alvin Wirthlin
Attorney, Agent, or Firm—Briggs and Morgan

[57] ABSTRACT

An image board comprising a base layer of aluminum, a filler layer of an amorphous polyester film such as Kodar® PETG copolyester film extrusion, two intermediate layers of polyester film such as Mylar®, two intermediate layers of a low molecular weight polymer such as Melanex-T®, and a bed layer of a rigid acrylic/PVC thermoplastic sheet having a top surface defining a level hair-line cell structure. The thickness of the image board is decreased compared with prior art image boards, to within a range of approximately 0.126"–0.131" at a minimum to approximately 0.171" at a maximum. The image board exhibits enhanced characteristics of stability, flexibility, and resistance to differential thermal expansion. A compressible register pin is selectively mounted on and removed from the reverse side of the image board, being slidably inserted and frictionally engaged in an aperture and contacting the base and intermediate layers. A flange on the base cap surrounds the aperture but projects downwardly from the reverse side of the base layer without causing interference when the image board is placed on a rigid working surface or within a platemaker.

47 Claims, 1 Drawing Sheet

U.S. Patent  Jan. 23, 1996  5,485,679
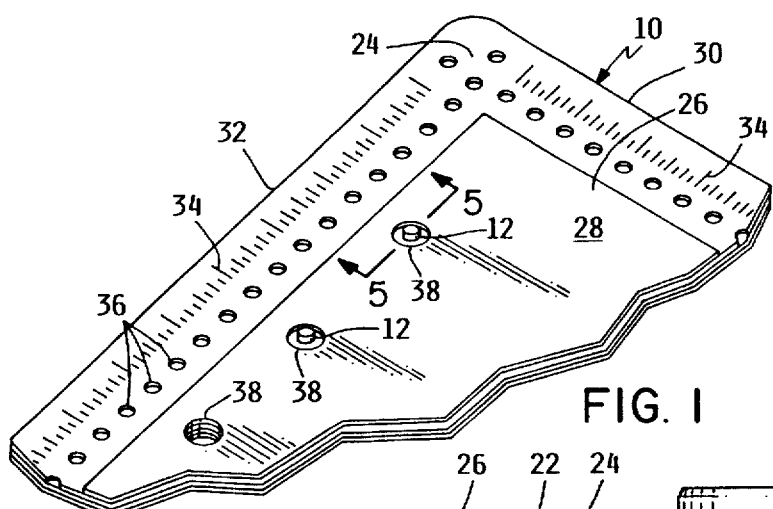
FIG. 1
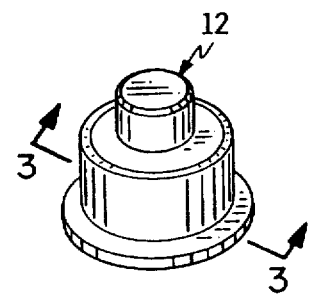
FIG. 2
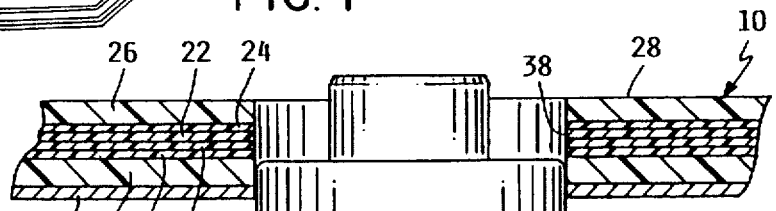
FIG. 5
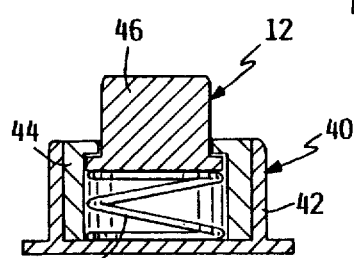
FIG. 3
FIG. 4
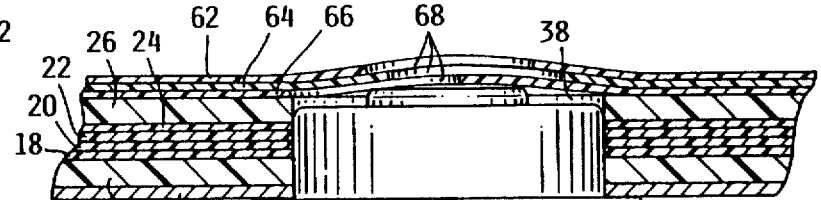
FIG. 6
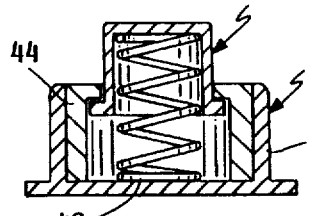
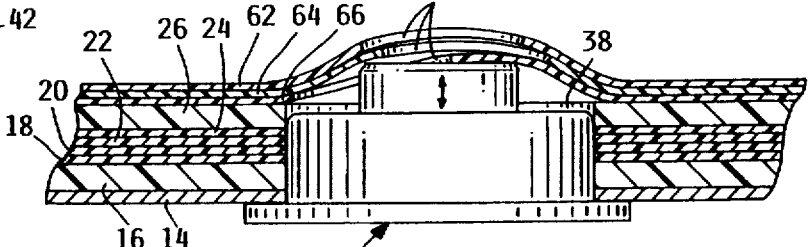
FIG. 7
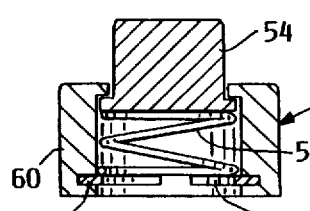
FIG. 9
(PRIOR ART)
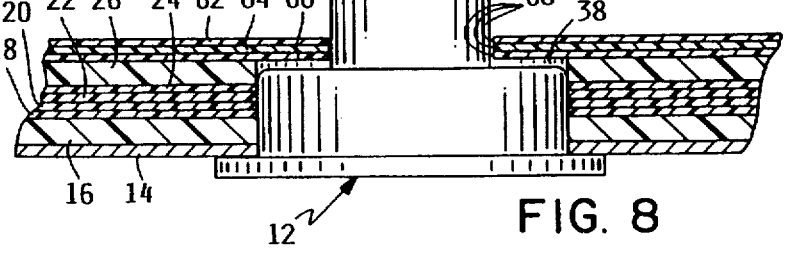
FIG. 8

IMAGE REGISTRATION BOARD AND COMPRESSIBLE PIN ASSEMBLY

BACKGROUND OF THE INVENTION

This invention relates generally to image registration boards and compressible pins of the type used in photomechanical platemaking primarily for lithographic printing, and particularly to those used in exposures utilizing vacuum frame or step-and-repeat registration systems for making plates, proofs or contact prints, and the like.

Most printing processes involve the step of making an intermediate image carrier which transfers the ink to the substrate (paper, fabric, film, etc.) to form a predetermined printed image on that substrate. The lithographic plate is normally a smooth, flexible sheet with the image and non-image areas confined within the same plane. This may be contrasted with gravure or letterpress printing, in which the image carrier has a rough surface with raised areas corresponding to the shape of the printed image.

In most photomechanical lithographic printing, the plate has an emulsion layer of one or more light-sensitive coatings and a metal backing. A negative image (or "flat") is placed directly on top of the plate, and the particular image corresponding to the clear areas of that negative is exposed or "burned" onto the plate using high intensity light. The area of the emulsion exposed to the light fuses to the metal backing and becomes chemically receptive to oil-based inks. The exposed plate is developed by wiping a developing chemical on the emulsion layer to remove the unexposed light-sensitive coatings, thereby leaving a smooth but visible image behind.

The developed plate is usually mounted on a rotating cylinder and coated with a thin layer of water during each revolution, with the water being attracted to the unexposed or non-image areas of the plate. Ink is applied to the plate during each revolution, with the ink being repelled by the water and attracted to the exposed or image areas of the plate. The ink is then transferred from the plate to the substrate as the cylinder and plate rotate. In offset lithographic printing, the ink is transferred from the image carrier to an intermediate blanket cylinder, and subsequently to the substrate.

The plates are generally burned within a machine called a "platemaker," which may be manual, automated, or a combination thereof. Most commercial photomechanical platemakers now utilize either a vacuum frame or a step-and-repeat machine.

In most platemakers, a fresh plate is placed emulsion side up on a supporting blanket or surface, and one or more flats are placed overlying the plate. A glass cover is lowered onto the flats and plates to press them into contact with one another and the underlying blanket. A vacuum is drawn between the blanket and glass cover, which pulls the flats into tight and uniform parallel contact with the plate. The light is then passed through the glass cover and flat to expose the plate.

Most platemakers use a pin register system to ensure proper and reproducible alignment between flats and plates, both before and during burning. The system comprises a row of small metal posts or registration pins that correspond to registration holes punched in the edges of both flats and plates. The flats and plates will be in correct alignment each time the punched registration holes are placed over pins having the corresponding registration positioning or array.

Prior to the actual platemaking exposure, the necessary flats must also be prepared by a process termed "page makeup" or "stripping." This involves positioning and adhering one or more negatives on a masking paper or polyester film, which then becomes the flat. The negatives are taped to the masking material, and the masking covering the image area is cut away to produce a window through which the light may pass. Light will be blocked by either the masking or the image area of the negative.

One flat may include all the negatives required for a specific plate, or a lesser number. For example, separate flats might be prepared for the halftone negatives and solid type to be printed in one color from a single plate. Making one plate from one flat uses one exposure or a "single burn." If two flats are used to make one plate, two exposures or a "double burn" are required. Additional flats for corrections, tints, and reverses may also be made in separate steps, and three or more exposures may then be used to make one plate. The multiple exposure of a single plate using more than one flat is generally referred to as "surprinting." Screen tints and some negative halftones may be accomplished by placing a ruled or dotted line screen between the particular flat and the plate.

The layout of negatives into flats and the alignment of flats for a plate may be done on a light table or layout device and then transferred to the platemaker. In some cases, page makeup may be performed on the platemaker itself. The page makeup process may take one step, or be extremely complicated. Consequently, proper registration or alignment of the various negatives, flats, and plates must be maintained during layout, stripping, transfer, as well as within the platemaker. Registration must also be consistent between plates used for each different type or color of ink in a multi-impression page, or when multiple plates are required for large runs.

Copy will generally be adhered to a mounting board and covered with an acetate overlay. Color breaks and other guide information will be written on other tissue overlays. The stripper will use register marks, corner marks, and keylines to position the negatives relative to the copy on the mounting board, and may also make reference to or actually use dummies and the original mechanicals to make negatives. A base negative generally shows as much copy as possible on a mounting board. The stripper may mask the original mechanical to prepare multiple negatives, or mask the base negative to make multiple plates for different colors. Smaller flats (from the same or different jobs) may be ganged together to make multiple plates in the same exposure on a single sheet of film or plate material. As an example, a sixteen page book printed in two colors with ten halftones requires forty-two negatives (sixteen for each color and ten for the halftones) assembled into six flats. Three flats are used for each side of the paper, comprising one set of type and line art for the first color, one set of type and line art for the second color, and one set for halftones in the first color. A larger book may have one thousand negatives assembled into one hundred flats, all which require uniform registration during layout, stripping, transfer, and platemaking.

Vacuum frames are generally used if all the negatives are stripped on a single flat or if one flat is used for two or more exposures on a plate. In that case, register pins are used to make sure the exposures are made in proper alignment. In contrast, if plates are made from positives, all the elements must be combined into a single flat before exposure.

Some vacuum frames permit variable exposure settings or utilize computerized programs for making plates, as well as proofs or contact prints (prints frequently used as test sheets made by exposing a negative in direct contact with photographic paper, and sometimes used as final output.) Some vacuum frames are adapted for high speed vacuum drawdowns to accelerate the exposure process. In any case, it is important to draw a strong and uniform vacuum in the vacuum frame, in order to maintain close uniform contact between the flats and plates. Close contact between the flat and plate prevents dot gain by light spreading between a negative flat and plate, or dot sharpening if the flat is a positive.

When a plate requires more than four exposures, or particularly accurate alignment, the vacuum frame is less economical and accurate than a step-and-repeat machine. The conventional horizontal step-and-repeat machine has a bed to support and mount the plate, with the flats and plate being held in tight contact by a vacuum during burning. The flats are mounted in a predetermined spaced-apart array on a chase which may be moved in exact increments transversely across the plate in two directions. A stationary lamp positioned above the plate makes each exposure, with the chase being stepped across the plate from one flat to another between exposures, and the process repeated for the number of flats and exposures required. The movement of the chase corresponds exactly to the array of flats.

Some step-and-repeat machines move the chase in response to commands from a program, and may be automated using cassettes containing films which correspond to each flat. Automated step-and-repeat machines are particularly useful where many subjects are burned on the same plates using a multiplicity of sequential flats, or in book production and computer-based publications where the layout and separation of each page is done on computer and printed directly to film negatives.

The flats may be positioned and repositioned on the chase or manual step-and-repeat registration board in larger spacing increments (usually of about one half inch) corresponding to the distance between movable pins placed in indexing holes in the chase or board, and may be positioned or shifted between the spacing increments in smaller increments using spacers. An example of this technique is disclosed in U.S. Pat. No. 2,983,049 to Andrisani.

The stripper can therefore perform the necessary page makeup by assembling the negatives into flats and positioning the flats on a step-and-repeat registration board, with the desired registration format being easily reproducible in subsequent layouts or on another registration board containing other elements of a plate. Shifts or corrections in the format may be translated to each registration board. The flats may also be transferred to any suitable chase in the desired format.

The process for making an intermediate image carrier should be contrasted with quick printing, in which a camera-direct paper or plastic plate (usually termed a "master") is made directly from the camera-ready artwork or "mechanical" using a process camera. Masters are generally good for less detailed images in which the run will be fewer than five thousand impressions, and masters do not require the more labor intensive steps of making and stripping negatives. Quick printing may be suitable for producing "good" quality work. However, photomechanical production of plates is needed when greater accuracy or reproducibility is required, or when the output is to be "premium" or "showcase" quality.

As such, improvements designed to minimize, accelerate, or automate the labor intensive steps of plate production are of great value to the industry. Of comparable value are improvements which insure or enhance output quality, particularly when those improvements are combined with systems to accelerate or automate any steps in the plate production process.

In a vacuum frame, the pivoting cover may press the register pins down into the blanket at an angle and tilt the posts, thereby causing the flat and plate to shift or buckle relative to one another. Alternately, discontinuities in the resilience of the blanket may lead to tilting of the register pins. This may lead to misalignment between the flats and plate and other distortions which may be carried through to or compounded by subsequent burns. Increased numbers of negatives and masking layers in a flat or combined flats and screens will lead to greater misalignment and distortion. Localized irregularities around the register pins (especially adjacent to the edges where the vacuum is drawn) may lead to a non-uniform vacuum being drawn over portions of the plate, thereby resulting in blooming or sharpening over larger areas of an image.

It is known to utilize register pins having smaller diameter bases than conventional metal base pins to mitigate against tilting, buckling, and distortion. It is also known to utilize register pins having compressible or retractable posts, or register pins which are mounted on a cushioning material within the board that deforms under pressure before the blanket.

However, such register pin assemblies incorporating compressible or retractable posts present a greater overall height than can be accomplished using a solid register pin. Since the body of the register pin must be disposed flush with or beneath the upper surface of the image registration board, this increased height requires a thicker image registration board to receive the register pin assembly. Alternately, a portion of the registration pin assembly must project beneath the base layer of the image registration board, thus deforming the blanket or permitting the register pins to be dislodged when the image registration board is placed on any rigid working surface.

In addition, it is desirable to minimize the thickness of the image registration board in order to decrease the weight of larger boards, reduce the displacement between the cover and the blanket in a platemaker, and to some extent control or compensate for the effect of differential thermal expansion between layers within the image registration board.

BRIEF SUMMARY OF THE INVENTION

It is therefore one object of this invention to design a compressible register pin and an image registration board which minimize the height of the body of the compressible pin and the thickness of the image registration board.

It is a further object of this invention to design the above compressible registration pin such that it may be selectively and removably received within an aperture or bore defined by the image registration board.

It is a related object of this invention to design the above compressible pin and image registration board such that the compressible register pin may be mounted or seated within the aperture and selectively removed therefrom without the use of tools or appliances.

It is another object of this invention to design the above compressible registration pin such that it may be mounted or seated within the aperture from the bottom or reverse side of the base layer of the image registration board.

It is an additional object of this invention to design the above compressible registration pin so as to minimize the degree to which the body of the compressible registration pin projects outwardly from the bottom or reverse side of the base layer of the image registration board.

It is a distinct object of this invention to design the above compressible registration pin such that the post is fully compressible or retractable under the weight of a cover, but will not compress or retract under the weight of multiple flats, screens, and plates if placed thereon with the punched registration holes therein not aligned to receive the post of the compressible registration pin.

It is a particular object of this invention to design the above image registration board so as to be less susceptible to the effects of differential thermal expansion or contraction during platemaking.

As used herein, it is contemplated that the terms image registration board or image board may comprise many different embodiments beyond the registration systems inherent to vacuum frames and step-and-repeat machines. Manual stepboards may be used in place of step-and-repeat machines, as backups, and in combination with vacuum frames. In addition, manual stepboards may be made in predetermined sizes or incorporating uniform registration systems keyed for compatibility with manufacturers' models or specific press plate sizes. Contact boards may be produced in unruled blanks and punched by the user to match the placement, spacing, and orientation of registration posts for a specific press to make alternatives to more expensive control boards or in place of stepboards for single burns.

As such, the terms image registration board or image board should be construed, whenever appropriate, to include any board utilized in the uniform and reproducible layout, page makeup, stripping, and transfer or transportation of flats, screens, or plates, and the exposure of negative and positive flats or plates in platemakers. The term registration pin relates to any pin or post assembly designed to align or hold a flat, screen, or plate in a predetermined or selected position on an image registration board or image board.

Briefly described, the image board of this invention comprises a metal primary base layer such as aluminum, a filler layer such as an amorphous polyester including Kodar® PETG copolyester film extrusion, two lower intermediate layers of polyester film such as Mylar®, two upper intermediate layers of a low molecular weight melanin polymer such as Melanex-T®, and a single top bed layer of a rigid acrylic/PVC thermoplastic sheet such as Uniroyal® DKE400 extrusion grade vinyl, preferably having a top surface defining a level hair-line cell structure. The total thickness of the image board is decreased compared with prior art image boards, to on the order of approximately 0.126"–0.131" at the lower end of the range up to 0.171" at the upper end of the range, but the image board exhibits enhanced characteristics of stability, flexibility, and resistance to differential thermal expansion.

The compressible registration pin of this invention comprises a base cap which receives a retaining collar, retractable post, and coil-type compression spring to bias the retractable post upwardly away from the base cap. The upright wall of the base cap has a height of approximately 0.125", while the retractable post moves through a stroke path of approximately 0.085" requiring approximately 0.625 lbs. cf pressure for substantial (on the order of 80%) compression and approximately 0.95 lbs. of pressure or greater for full compression.

The compressible register pin may be selectively mounted on and removed from a corresponding aperture in the image board from the reverse side of the image board, with the body being slidably inserted and frictionally engaged in the aperture and contacting the base and intermediate layers of the image board, with the retractable post extending above the bed layer. A flange member on the base cap contacts the base layer of the image board and projects outwardly around the aperture and downwardly from the reverse side of the base layer to maintain the compressible registration pin in proper position and alignment within the aperture without causing interference when the image board is placed on a rigid working surface or within a platemaker.

BRIEF DESCRIPTION OF THE DRAWINGS

FIG. 1 is a broken away perspective view of a step-and-repeat type registration board exemplary of the image registration board of this invention, with a pair of compressible registration pin of this invention mounted in two apertures therein;

FIG. 2 is a perspective view of the compressible registration pin of this invention;

FIG. 3 is a cross section view of the compressible registration pin of FIG. 2 taken through line 3—3 of FIG. 2;

FIG. 4 is a cross section view of an alternate embodiment of the compressible registration pin of FIG. 2 taken through line 3—3 of FIG. 2;

FIG. 5 is a partial cross section view of the image registration board and compressible registration pin of FIG. 1 taken through line 5—5 of FIG. 1 showing the compressible registration pin partially received or mounted within the aperture;

FIG. 6 is a partial cross section view of the image registration board and compressible registration pin of FIG. 1 taken through line 5—5 of FIG. 1 showing the compressible registration pin completely received and mounted within the aperture with the post completely retracted under the weight of flats and plates placed thereon;

FIG. 7 is a partial cross section view of the image registration board and compressible registration pin of FIG. 1 taken through line 5—5 of FIG. 1 showing the compressible registration pin completely received and mounted within the aperture with the post extended and supporting the weight of flats and plates placed thereon;

FIG. 8 is a partial cross section view of the image registration board and compressible registration pin of FIG. 1 taken through line 5—5 of FIG. 1 showing the compressible registration pin completely received and mounted within the aperture with the post extended and received within the punched registration holes of the flats and plates placed thereon; and FIG. 9 is a cross section view of a prior art compressible pin.

DESCRIPTION OF THE PREFERRED EMBODIMENTS

The image board 10 and compressible registration pin 12 of this invention are shown in FIGS. 1–8 and referenced generally therein.

Referring particularly to FIG. 1, it may be seen that the image board 10 depicted for exemplary purposes is a step-and-repeat registration board or stepboard of the type disclosed generally in U.S. Pat. Nos. 2,983 049 to Andrisani and 4,987,686 to Ternes.

Referring particularly to FIG. 5, it may be seen that the image board 10 includes a generally planar primary base layer 14 of #2024 T6 alclad aluminum having a thickness of 0.040" having a smooth bottom surface, a secondary base layer or filler layer 16 of a plastic sheet material including a clear, amorphous polyester such as Kodar® PETG copolyester #6763 film extrusion adhered to the top surface of the primary base layer 14, two synthetic polymeric lower intermediate layers 18, 20 of a polyester film such as 0.014" thick Du Pont Mylar® adhered to one another and to the top surface of the filler layer 16, two synthetic polymeric upper intermediate layers 22, 24 of an anionic low molecular weight melanin polymer such as 0.014" thick #226 Melanex-T® adhered to one another and to the upper surface of the topmost lower intermediate layer 20, and a single synthetic polymeric top bed layer 26 of a rigid acrylic/PVC thermoplastic sheet such as 0.030"–0.035" thick Uniroyal® DKE400 extrusion grade vinyl, preferably having a top surface 28 defining a level hair-line cell structure of uniformly oriented peaks and intersecting valleys having a depth of approximately 0.003"–0.004". Alternately,, for enhanced thermal characteristics, the filler layer 16 may if desired be coextruded with the Mylar® film referenced for layers 18, 20.

Referring to FIG. 1, it may be seen that the top bed layer 26 is inset transversely from the outer peripheral edges 30, 32 of the image board 10, such that the topmost upper intermediate layer 24 defines a border region surrounding the top bed layer 26 which may be imprinted with rulers 34. The border may define a plurality of circular indexing holes 36 spaced evenly at predetermined spacing distances along the rulers 34 and having center points aligned with major ticks of the rulers 34. The indexing holes 36 extend through both of the upper intermediate layers 22, 24, with the diameter of the indexing holes 36 in the lowermost upper intermediate layer 22 being slightly greater than the diameter of the corresponding aligned holes 36 in the uppermost upper intermediate layer 24 to provide relief when spacer pins (not shown) are received therein.

The image board 10 further defines one or more circular apertures 38 or bores extending entirely through each of the base, intermediate, and bed layers 14–26 and having a centerline substantially perpendicular thereto, and spaced apart in a predetermined pattern or array on the image board 10.

The image board 10 may alternately define a border region having no indexing holes 36 or rulers 34, may alternately omit the border region entirely, and may omit the circular apertures 38.

Referring to FIGS. 2–4, it may be seen that the compressible registration pin 12 comprises a two-piece body 40 having a base cap 42 and a retaining collar 44, and further including a retractable post 46 and spring 48. The compressible registration pin 12 depicted for exemplary purposes corresponds generally with a convention ¼" round standard register pin.

The base cap 42 comprises a hollow upright cylindrical wall having an outer diameter of 0.500" and an inner diameter of 0.374" the cylindrical wall extending upwardly from the top surface of a circular base plate a distance of 0.125" and forming a generally cylindrical partial enclosure. The circular base plate has a thickness of 0.020" and extends radially outward from the outer cylindrical surface of the cylindrical wall a distance of 0.060" to form a flange member. The base cap is preferably fabricated from #2011 T3 aluminum. It should be noted that the total thickness of the base, intermediate, and bed layers 14–26 of the image board 10 may range from approximately 0.126"–0.131" when no filler layer 16 is utilized to approximately 0.171" when a filler layer 16 of 0.040" thickness is utilized, such that the total thickness may be optimized within that range to a height slightly greater than the height of the cylindrical wall of the base cap 42.

The retaining collar 44 comprises a hollow upright cylindrical wall having a height of 0.150" and outer diameter of 0.375" an inner diameter of 0.281" at the base thereof, and an inner diameter of 0.250" at the top thereof, thus forming an inwardly extending radial lip having a height of 0.040" measured downwardly from the top of the retaining collar 44. The retaining collar is preferably fabricated from #360 free machining brass.

The retractable post 46 preferably comprises a hollow upright cylindrical wall having an outer height of 0.150", an outer diameter of 0.249" at the top thereof, an inner diameter of 0.1875", and an outer diameter of 0.280" at the bottom thereof, thus forming an outwardly extending radial lip having a height of 0.025" measured upwardly from the bottom of the retractable post 46. The retractable post 46 further has an enclosed top end with an inner height of 0.130". The retractable post 46 is preferably fabricated from 416-5F stainless steel free machining brass. As shown in FIG. 3, the retractable post 46 may also comprise a solid body having a generally planar bottom surface.

The spring 48 is preferably a coil-type compression spring fabricated from 6 coils of 0.016" diameter steel piano wire having flat ground ends. The spring is wound to an outside diameter of 0.175" so as to be free-fitting within a 0.1875" diameter opening, and to have an overall length of 0.437" between opposing parallel ends. The spring 48 has a spring constant on the order of about 7.4 lbs./in. or greater, and preferably on the order of about 11 lbs./in. or greater.

It may be seen that the retractable post 46 is slidably received through the retaining collar 44 with the outwardly extending lip of the retractable post 46 disposed beneath and retained against upward movement by the inwardly extending lip of the retaining collar 44, such that the retractable post 46 is mounted for reciprocal linear movement relative to the body 40. The spring 48 is disposed within the base cap 42 generally centered along and circumscribing the common centerline of the base cap 42, retaining collar 44, and retractable post 46. The retaining collar is then forcibly mounted and snugly seated within the base cap 42, thus compressing and trapping the spring 48 within and between the base cap 42 and retractable post 46 such that the spring 48 constantly urges the retractable post 46 upwardly and away from the base cap 42. The retractable post 46 has a maximum linear displacement of 0.090" but preferably moves through an operative stroke path of 0.085" requiring approximately 0.625 lbs. of pressure for substantial (on the order of 80%) compression and approximately 0.95 lbs. of pressure or greater for full compression. The spring 48 therefore has a spring constant on the order of about 7.4 lbs./in. or greater, and preferably on the order of about 11 lbs./in. or greater.

While the spring may contact the bottom surface of a solid retractable post 46 as shown in FIG. 3, it has proven more suitable to extend the spring upwardly within the hollow retractable post 46 as shown in FIG. 4 to contact the underside surface of the closed top end of the retractable post 46, thereby minimizing any tendency of the retractable post 46 to tilt and bind within the bore of the retaining collar 44 due to the close tolerances therebetween. The top peripheral edge of the retractable pin 46 is preferably beveled or rounded a distance of 0.005" from the top thereof, with that beveled portion remaining disposed above the top of the retaining collar when the retractable pin 46 is fully compressed within the body 40 of the compressible register pin 12.

In operation, the compressible register pin 12 is selectively aligned with one of the circular apertures 38 in the image board 10, with the retractable post 46 facing toward the bottom or reverse side surface of the primary base layer 14 as shown in FIG. 5. The retractable post 46 and body 40 of the compressible register pin 12 are slidably inserted into and received within the aperture 38 with the upright cylindrical wall of the base cap 42 contacting the base, intermediate, and bed layers 14–26 of the image board 10 and being frictionally secured therein to completely mount the compressible registration pin 12 in and to the image board 10 with the flange member of the base cap 42 contacting the bottom surface of the primary base layer 14 of the image board 10 as shown in FIG. 8. The circular base plate and flange member have a diameter of 0.625" and project downwardly from the bottom or reverse side of the primary base layer 14 of the image board 10 approximately 0.020" and therefore maintain the compressible registration pin 12 in proper alignment within the aperture without causing interference when the image board 10 is placed on a rigid working surface or within a platemaker. The compressible register pin 12 may be selectively and slidably removed from the aperture 38 in the image board 10 by grasping or gripping the circular base plate and flange member of the base cap 42 and forcibly withdrawing the body 40 from the aperture 38, or prying the body 40 away from the primary base layer 14 using a thin instrument inserted between the primary base layer 14 and flange member of the base cap 42.

Referring particularly to FIGS. 6–8, it may be seen that the top surfaces of the base cap 42 and retaining collar 44 are recessed slightly below the top surface of the top bed layer 26 when the body 40 of the compressible registration pin 12 is fully or completely received or mounted within the aperture 38. Where the total thickness of the base, intermediate, and bed layers 14–26 is approximately equal to or slightly greater than the height of the cylindrical wall of the base cap 42, the recess would be approximately equal to the difference between the combined thicknesses of the base and intermediate layers 14–26 plus any combined adhesive thickness between the base and intermediate layers 14–26 less the height of the cylindrical wall of the base cap 42.

Referring to FIGS. 6–8, it may be seen that once the compressible registration pin 12 is fully mounted on the image board 10, one or more fleets 62, 64 and a plate 66 may be attached in proper registration by aligning the circular or irregularly shaped registration holes 68 punched through the flats 62, 64 and plate 66 (or defined by stripping tabs adhered to the edges of the flats 62, 64 and plate 66) over the retractable post 46. One of the flats 64 may alternately be a screen or similar sheet.

If the punched registration holes 68 are not properly aligned with one another and with the corresponding retractable post 46, the spring 48 should have sufficient upward force so as not to compress under the weight of the flats 62, 64 and plate 66 as shown in FIG. 6, but rather to lift the flats 62, 64 and plate 66 above the body 40 of the compressible registration pin 12 and the top surface of the top bed layer 26 as shown in FIG. 7.

The retractable post 46 and punched registration holes 68 may also have corresponding and matching irregular cross sectional shapes when viewed in top plan view, so as to be interchangeable with conventional registration systems having both round or elongated posts and holes. The diameters of the retractable post 46 and punched registration holes 68, and therefore the related components of the compressible registration pin 12, may be adapted to fit varying configurations such as $3/16$" round, $1/4$"×$5/16$" and $3/16$"×$1/4$" elongated round, $1/8$" and $5/32$" round for stripping pins, 5 mm and 6 mm metric round, 5 mm×$1/4$" and 6 mm×$5/16$" metric elongated, $5/16$", $3/8$" and $1/2$" special round, or $3/16$"×$3/8$" and $1/4$"×$3/8$" special elongated. In a $3/16$" round pin, for example, the spring 48 would be wound from the same wire to a 0.143" diameter, with the outer diameter of the retractable post being approximately 186"–187" and the inside diameter being approximately 0.155"–0.156".

Referring to FIG. 9, a retractable registration pin 50 of a prior art design is shown, in which the spring 52 is disposed and retained between the bottom surface of a solid post 54 and the upper surface of a compressible U-ring 56 received within a cylindrical groove 58 recessed into the upright cylindrical wall of the body 60 of the retractable registration pin 50. The retractable registration pin 50 is inserted into a corresponding aperture (not shown) in an image board (not shown) from the front or upper side, and is securely fastened within the aperture and affixed to the image board.

While the preferred embodiments of the above image board 10 and compressible registration pin 12 have been described in detail with reference to the attached drawing Figures, it is understood that various changes and adaptations may be made in the image board 10 and compressible registration pin 12 without departing from the spirit and scope of the appended claims.

In addition, the particular materials and brands referenced herein and incorporated within the claims relating to the polymeric layers 18–26 are intended as representing suitable and preferred embodiments, but are not an exhaustive recitation of all materials or brands that may function in substantially the same manner to achieve substantially the same result. Consequently, it is understood that various materials having similar properties and functioning in substantially the same manner as those recited may be substituted for those recited to achieve substantially the same result, would be encompassed by the claims as appended.

What is claimed is:

1. An image board and compressible pin assembly for use in maintaining the registration of a flat or a plate during layout, stripping, transfer, or in a platemaker, said flat or said plate having at least one registration hole associated therewith, said platemaker having a cover movable into close parallel contact with said flat or said plate, said image board and compressible pin assembly comprising:

an image board having at least one base layer, at least one filler layer connected to and disposed above said base layer, at least one intermediate layer connected to and disposed above said at least one filler layer, and a bed layer connected to and disposed above said at least one intermediate layer, said at least one base layer having a bottom surface and said bed layer having a top surface, said image board defining an aperture extending entirely through each of said at least one base layer, said at least one filler layer, said at least one intermediate layer, and said bed layer, said image board defining a top side adjacent said top surface of said bed layer and a reverse side adjacent said bottom surface of said at least one base layer; and a compressible registration pin having a body and a post mounted for reciprocal movement relative to said body, said body being selectively and removably mountable within said aperture from said reverse side of said image board, said body including a flange member projecting therefrom, said flange member contacting said bottom surface of said base layer when said body is completely mounted within said aperture, at least a portion of said post initially extending above said top surface of said bed layer such that the flat or the plate may be placed thereon with the registration hole thereof receiving said portion of said post extending above said top surface of said bed layer therein when said post is in an extended position, said post being movable to a retracted position in response to contact between the cover of the platemaker and said post.

2. The image board and compressible pin assembly of claim 1 wherein a plurlaity of the flats or the plates may be placed on the post for registration, said plurality of the flats or the plates having a thickness substantially equal to the portion of the post initially extending above the top surface of the bed layer when the post is in the extended positioni, and further wherein the post will not move to the retracted position in response to the weight of said plurality of the flats or the plates being placed thereon with the registration holes thereof not aligned with the post.

3. The image board and compressible pin assembly of claim 1 wherein the body is mounted on the image board by frictional engagement between the body and one or more of the at least one base layer, the at least one filler layer, the at least one intermediate layer, and the bed layer.

4. The image board and compressible pin assembly of claim 1 wherein the at least one filler layer is fabricated from a generally amorphous copolyester.

5. The image board and compressible pin assembly of claim 4 wherein the at least one filler layer is a clear, amorphous copolyester film extrusion.

6. The image board and compressible pin assembly of claim 4 wherein the at least one filler layer is fabricated from Kodar® PETG #6763 copolyester.

7. The image board and compressible pin assembly of claim 1 wherein the at least one filler layer is fabricated from an extruded polyester film material selected from a group including Kodar® PETG #6763 copolyester and Du Pont Mylar® polyester.

8. The image board and compressible pin assembly of claim 1 wherein the number of the at least one intermediate layer is at least two, including at least one lower intermediate layer and at least one upper intermediate layer.

9. The image board and compressible pin assembly of claim 8 wherein the at least one lower intermediate layer is coextruded with the filler layer.

10. The image board and compressible pin assembly of claim 8 wherein each of the at least one lower intermediate layer is a polyester film.

11. The image board and compressible pin assembly of claim 10 wherein each of the at least one lower intermediate layer is Du Pont Mylar® polyester.

12. The image board and compressible pin assembly of claim 8 wherein the number of the at least one lower intermediate layer is two, each of said two of the at least one lower intermediate layer having approximately equal thickness to one another and being fabricated from a polyester film.

13. The image board and compressible pin assembly of claim 8 wherein the number of the at least one upper intermediate layer is two, each of said two of the at least one upper intermediate layer having approximately equal thickness to one another and being fabricated from a low molecular weight melanin polymer.

14. The image board and compressible pin assembly of claim 8 wherein each of the at least one upper intermediate layer is a low molecular weight melanin polymer.

15. The image board and compressible pin assembly of claim 14 wherein each of the at least one upper intermediate layer is Melanex-T® low molecular weight melanin polymer.

16. The image board and compressible pin assembly of claim 1 wherein the post has a bottom end and incudes an outwardly extending radial lip proximate to said bottom end thereof, and wherein the body of the compressible pin assembly comprises:

a base cap having a generally upright wall forming a partial enclosure;

a retaining collar received and secured within said partial enclosure fo said base cap and defining a bore, said retaining collar having a top end and defining an inwardly extending radial lip proximate to said top end thereof;

whereby the post is receive dthrough the bore of the retaining collar such that the outwardly extending radial lip of the post is disposed beneath the inwardly extending radial lip of the retaining collar, the inwardly extending radial lip of the retaining collar preventing the outwardly extending radial lip of the post from passing entirely through the bore so as to retain the post within the body, the post being slidably movable within the bore to the retracted position in which at least a portion of the post is disposed within the partial enclosure of the base cap.

17. the image board and compressible pin assembly of claim 16 wherein the base cap has a bottom end and wherein the flange member extends radially outward from the base cap adjacent said bottom end thereof.

18. The image board and compressible pin assembly of claim 16 wherein the retaining collar is fabricated from brass.

19. The image board and compressible pin assembly of claim 16 wherein the base cap is fabricated from aluminum.

20. The image board and compressible pin assembly of claim 1 wherein the post is fabricated from stainless steel.

21. The image board and compressible pin assembly of claim 1 wherein the post is urged from the retracted position to the extended position by a spring.

22. The image board and compressible pin assembly of claim 21 wherein the spring is a coil-type compression spring.

23. The image board and compressible pin assembly of claim 22 wherein the spring is fabricated from six coils of 0.016" diameter steel piano wire having flat ground ends and wound to an outside diameter on the order of 0.175" and having an overall length on the order of 0.437".

24. The image board and compressible pin assembly of claim 22 wherein the spring has a spring constant on the order of 7.4 lbs./inch or greater.

25. The image board and compressible pin assembly of claim 24 wherein the spring has a spring constant on the order of 11 lbs./inch or greater.

26. The image board and compressible pin assembly of claim 31 wherein the post moves through a stroke path of approximately 0.085" to move from the extended to the retracted position, and wherein approximately 0.625 lbs. of pressure or greater is required to move the post substantially to the retracted position.

27. The image board and compressible pin assembly of claim 26 wherein approximately 0.95 lbs. of pressure or greater is required to move the post to the retracted position.

28. The image board and compressible pin assembly of claim 21 wherein the body includes a base cap defining a partial enclosure and the spring is disposed between the post and said base cap within said partial enclosure.

29. The image board and compressible pin assembly of claim 28 wherein the post defines a generally hollow interior and includes a top cap, and wherein at least a portion of the spring is received within said hollow interior of the post and contacts said top cap of the post.

30. The image board and compressible pin assembly of claim 1 wherein the image board has a thickness on the order of 0.171" or less.

31. The image board and compressible pin assembly of claim 1 wherein the at least one filler layer of the image board has a thickness on the order of 0.40".

32. The image board and compressible pin assembly of claim 1 wherein the top bed layer of the image board is fabricated from a rigid acrylic/PVC thermoplastic sheet.

33. The image board and compressible pin assembly of claim 32 wherein the top bed layer is fabricated from Uniroyal DKE400 extrusion grade vinyl.

34. The image board and compressible pin assembly of claim 32 wherein the top surface of the top bed layer has a thickness on the order of 0.030"–0.035".

35. The image board and compressible pin assembly of claim 1 wherein the number of the at least one intermediate layer is four, each of said four of the at least one intermediate layer having approximately equal thickness to one another.

36. An image board for use in maintaining the registration of a flat or a plate during layout, stripping, transfer, or in a platemaker, said image board having an image layout area, said image board comprising:

at least one base layer;

at least one filler layer connected to and disposed above said at least one base layer, said at least one filler layer being fabricated from a generally amorphous copolyester sheet material and extending substantially coextensive with the image layout area;

at least one intermediate layer connected to and disposed above said at least one filler layer sheet material and extending substantially coextensive with the image layout area; and a bed layer connected to and disposed above said at least one intermediate layer, said bed layer defining the image layout area.

37. The image board of claim 36 wherein the at least one filler layer is a clear, amorphous copolyester film extrusion.

38. The image board of claim 36 wherein the at least one filler layer is fabricated from Kodar® PETG #6763 copolyester.

39. The image board of claim 37 wherein the number of the at least one intermediate layer is at least two, including at least one upper intermediate layer and at least one lower intermediate layer.

40. The image board of claim 39 wherein each of the at least one lower intermediate layer is a polyester film.

41. The image board of claim 40 wherein each of the at least one lower intermediate layer is Du Pont Mylar® polyester.

42. The image board of claim 39 wherein each of the at least one upper intermediate layer is a low molecular weight melanin polymer.

43. The image board of claim 42 wherein each of the at least one upper intermediate layer is Melanex-T® low molecular weight melanin polymer.

44. An image board for use in maintaining the registration of a flat or a plate during layout, stripping, transfer, or in a platemaker, said image board comprising:

at least one base layer;

at least one filler layer connected to and disposed above said at least one base layer, said at least one filler layer being fabricated from an amorphous polyester film;

at least one intermediate layer connected to and disposed above said at least one base layer; and a bed layer connected to and disposed above said at least one filler layer and said at least one intermediate layer.

45. The image board of claim 44 wherein the at least one filler layer is fabricated form Kodar® PETG #6763 copolyester film extrusion.

46. The image board of claim 44 wherein the at least one filler layer has a thickness approximately on the order of 0.40".

47. In an image board and compressible pin assembly for use in maintaining the registration of a flat or plate during layout, stripping, transfer, or in a platemaker, said flat or plate having at least one registration hole associated therewith, said image board and compressible pin assembly including an image board having a bottom surface and a top surface, said image board defining an aperture extending entirely therethrough, said image board defining a top side adjacent said top surface and a reverse side adjacent said bottom surface, said platemaker having a cover movable into close parallel contact with said flat or plate, the improvement comprising:

a compressible registration pin having a body and a post mounted for reciprocal movement relative to said body, said body being selectively and removably mountable within the aperture of the image board, said body including a flange member contacting the bottom surface of the image board when said body is completely mounted within the aperture, at least a portion of said post initially extending above the top surface of the image board such that the flat or plate may be placed thereon with the registration hole thereof receiving said portion of said post extending above the top surface of the image board therein when said post is in an extended position, said post being movable to a retracted position in response to contact between the cover of the platemaker and said post.

* * * * *